United States Patent
Wang (10) Patent No.: US 12,550,605 B2
(45) Date of Patent: Feb. 10, 2026

(54) ELECTRON TRANSPORT MATERIAL, ELECTROLUMINESCENT DEVICE AND PREPARATION METHOD THEREFOR, AND DISPLAY APPARATUS

(71) Applicants: Beijing BOE Technology Development Co., Ltd., Beijing (CN); BOE Technology Group Co., Ltd., Beijing (CN)

(72) Inventor: Haowei Wang, Beijing (CN)

(73) Assignees: Beijing BOE Technology Development Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 323 days.

(21) Appl. No.: 18/271,042

(22) PCT Filed: Jul. 13, 2022

(86) PCT No.: PCT/CN2022/105413
§ 371 (c)(1),
(2) Date: Jul. 6, 2023

(87) PCT Pub. No.: WO2023/005665
PCT Pub. Date: Feb. 2, 2023

(65) Prior Publication Data
US 2024/0099124 A1    Mar. 21, 2024

(30) Foreign Application Priority Data
Jul. 26, 2021  (CN) .......................... 202110846237.1

(51) Int. Cl.
*H10K 85/30* (2023.01)
*C07F 3/06* (2006.01)
(Continued)

(52) U.S. Cl.
CPC ............. *H10K 85/381* (2023.02); *C07F 3/06* (2013.01); *H10K 71/12* (2023.02); *H10K 50/16* (2023.02)

(58) Field of Classification Search
None
See application file for complete search history.

(56) References Cited

U.S. PATENT DOCUMENTS

| | | |
|---|---|---|
| 2018/0251640 A1 | 9/2018 | Reiser et al. |
| 2019/0288230 A1 | 9/2019 | Kim et al. |
| | (Continued) | |

FOREIGN PATENT DOCUMENTS

| | | |
|---|---|---|
| CN | 109935708 A | 6/2019 |
| CN | 109962127 A | 7/2019 |
| | (Continued) | |

OTHER PUBLICATIONS

International Search Report for PCT/CN2022/105413 Mailed Sep. 22, 2022.
(Continued)

*Primary Examiner* — Anthony Ho
(74) *Attorney, Agent, or Firm* — Ling Wu; Stephen Yang; Ling and Yang Intellectual Property (57) ABSTRACT

An electron transport material, an electroluminescent device and a preparation method therefor, and a display apparatus. The electron transport material includes: inorganic metal oxide nanoparticles, and a ligand for modifying the inorganic metal oxide nanoparticles, wherein the ligand includes a coordination group, and the coordination group is coordinated with and bound to at least one of a hydroxyl group and a metal cation on the surface of the inorganic metal oxide nanoparticles.

20 Claims, 6 Drawing Sheets

(51) Int. Cl.
*H10K 71/12* (2023.01)
*H10K 50/16* (2023.01)

(56) References Cited

U.S. PATENT DOCUMENTS

2022/0302401 A1 9/2022 Wang et al.
2022/0328786 A1 10/2022 Nie et al.

FOREIGN PATENT DOCUMENTS

| CN | 113130772 A | 7/2021 |
| CN | 113801648 A | 12/2021 |
| CN | 113809271 A | 12/2021 |
| CN | 113831786 A | 12/2021 |
| WO | 2017106811 A1 | 6/2017 |
| WO | 2020108070 A1 | 6/2020 |
| WO | 2021129665 A1 | 7/2021 |

OTHER PUBLICATIONS

Xingliang Dai et al., Solution-processed, high-performance light-emitting diodes based on quantum dots, Nature, 2014.
Lei Qian et al., Stable and efficient quantum-dot light-emitting diodes based on solution-processed multilayer structures, Nature Photonics, vol. 5, pp. 543-548, 2011.
Benjamin S. Mashford et al., High-efficiency quantum-dot light-emitting devices with enhanced charge injection, Nature Photonics, vol. 7, pp. 407-412, 2013.
Yixing Yang et al., High-efficiency light-emitting devices based on quantum dots with tailored nanostructures, Nature Photonics, vol. 9, pp. 259-266, 2015.
Office Action dated Dec. 12, 2025 for CN 202110846237.1 and English Translation.

ELECTRON TRANSPORT MATERIAL, ELECTROLUMINESCENT DEVICE AND PREPARATION METHOD THEREFOR, AND DISPLAY APPARATUS

CROSS-REFERENCE TO RELATED APPLICATIONS

This application is a national stage application of PCT Application No. PCT/CN2022/105413, which is filed on Jul. 13, 2022, and claims priority of Chinese Patent Application No. 202110846237.1, filed to the CNIPA on Jul. 26, 2021 and entitled "Electron Transport Material, Electroluminescent Device and Preparation Method Therefor, and Display Apparatus", the contents of which should be construed as being incorporated into the present disclosure by reference.

TECHNICAL FIELD

Embodiments of the present disclosure relate to, but are not limited to, the field of display technologies, in particular to an electron transport material, an electroluminescent device and a preparation method therefor, and a display apparatus including the electroluminescent device.

BACKGROUND

In recent years, Quantum-Dots Light Emitting Diodes (QLEDs) with fluorescent quantum dots as a light emitting layer have gradually become a highly promising display and light emitting device. At present, effective QLED devices are achieved by constructing a hybrid "sandwich structure" with quantum dots as a light emitting layer, an organic material as a hole transport layer and inorganic metal oxide nanoparticles (e.g., zinc oxide nanoparticles) as an electron transport layer.

Compared with an organic electron transport layer, an inorganic electron transport layer may significantly enhance the efficiency and service life of quantum dot light emitting diodes, because the inorganic electron transport layer has a low electron injection barrier, a high mobility and effective hole block, and can obtain better charge injection. Using inorganic oxides as an electron transport layer is a mainstream solution in quantum dot light emitting diodes at present, but some shortcomings of inorganic oxides also limit the development of the quantum dot light emitting diodes. For example, at present, N-type metal oxides such as ZnO and ZnMgO with a low work function are often used as an electron transport layer in a quantum dot light emitting device. However, defect sites on a surface of zinc oxide, e.g., hydroxyl functional groups (—OH) and oxygen vacancies, will lead to rapid degradation of the device, also lead to electron transfer at an interface thereof, incur exciton dissociation, and also disrupt electroneutrality of quantum dots, resulting in electrification of quantum dots and generation of Auger recombination channels with non-radiative transitions, thereby reducing fluorescence performance of quantum dots and efficiency and stability of the quantum dot light emitting diode. In addition, the excessively high electron mobility of inorganic metal oxides will lead to imbalance of carrier injection, which worsens the performance of the device.

SUMMARY

The following is a summary of subject matters described herein in detail. The summary is not intended to limit the protection scope of the present disclosure.

An embodiment of the present disclosure provides an electron transport material, including: an inorganic metal oxide nanoparticle and a ligand modifying the inorganic metal oxide nanoparticle, the ligand including a coordination group coordination-bonded to a defect site on a surface of the inorganic metal oxide nanoparticle, the defect site including at least one of a hydroxyl group and a metal cation.

In an exemplary embodiment, the coordination group may be selected from any one or more of amino, polyamino, hydroxyl, polyhydroxyl, carboxyl, mercapto, polymercapto, thioether, polythioether, phosphino and phosphinyl.

In an exemplary embodiment, the ligand may further include a ligand length regulating group which may be an alkyl chain.

In an exemplary embodiment, the number of carbon atoms of the alkyl chain may be 1 to 18.

In an exemplary embodiment, the alkyl chain may be at least one of ethyl, n-butyl, tert-butyl, n-octyl, tert-butylphenyl, methoxyl, or n-butoxyl.

In an exemplary embodiment, the ligand may further include a dissolving group, which is a group dissolved in a polar solvent, a group dissolved in a non-polar solvent, or a crosslinking group.

In an exemplary embodiment, the group dissolved in the polar solvent may be selected from any one or more of amino, polyamino, hydroxyl, polyhydroxyl, mercapto and polymercapto.

In an exemplary embodiment, the group dissolved in the non-polar solvent may be selected from any one or more of methyl and ethyl.

In an exemplary embodiment, the crosslinking group may be selected from any one or more of a double bond, a triple bond and an epoxy bond.

In an exemplary embodiment, the inorganic metal oxide may be selected from any one or more of an N-type metal oxide nanoparticle and a P-type metal oxide nanoparticle, the N-type metal oxide nanoparticle may include a ZnO nanoparticle and a $TiO_2$ nanoparticle, and the P-type metal oxide nanoparticle may include a $SnO_2$ nanoparticle, a $ZrO_2$ nanoparticle, a NiO nanoparticle, a $WoO_3$ nanoparticle, a $V_2O_5$ nanoparticle, a CuO nanoparticle, a CuS nanoparticle, a CuSCN nanoparticle and a Cu:NiO nanoparticle.

An embodiment of the present disclosure further provides an electroluminescent device, including an electron transport layer, a material of the electron transport layer being the electron transport material described above.

An embodiment of the present disclosure further provides a preparation method for an electroluminescent device, including:
  preparing an inorganic metal oxide nanoparticle thin film or preparing an inorganic metal oxide thin film; and
  performing interface modification on at least one of a hydroxyl group and a metal cation on a surface of the inorganic metal oxide nanoparticle thin film or the inorganic metal oxide thin film by using a ligand.

In an exemplary embodiment, the performing interface modification on at least one of a hydroxyl group and a metal cation on a surface of the inorganic metal oxide nanoparticle thin film or the inorganic metal oxide thin film by using a ligand may include:
  dissolving a ligand precursor in a solvent to prepare a ligand precursor solution; and
  dropping the ligand precursor solution onto the surface of the inorganic metal oxide nanoparticle thin film or the inorganic metal oxide thin film, standing, spinning dry, and cleaning with the solvent.

In an exemplary embodiment, when the inorganic metal oxide is zinc oxide, the preparation method may include: modifying hydroxyl groups and $Zn^+$ vacancies on the surface of the zinc oxide nanoparticle thin film or the zinc oxide thin film, wherein a ligand precursor of a ligand modifying the hydroxyl groups on the surface of the zinc oxide nanoparticle thin film or the zinc oxide thin film is 1,12-dodecanedioic acid, and a ligand precursor of a ligand modifying the $Zn^+$ vacancies on the surface of the zinc oxide nanoparticle thin film or the zinc oxide thin film is 1,12-dodecanedithiol.

In an exemplary embodiment, when the inorganic metal oxide is zinc oxide, the preparation method may include: modifying hydroxyl groups and $Zn^+$ vacancies on the surface of the zinc oxide nanoparticle thin film or the zinc oxide thin film, wherein a ligand precursor of a ligand modifying the hydroxyl groups on the surface of the zinc oxide nanoparticle thin film or the zinc oxide thin film is lauric acid, and a ligand precursor of a ligand modifying the $Zn^+$ vacancies on the surface of the zinc oxide nanoparticle thin film or the zinc oxide thin film is dodecanethiol.

Figure 13:
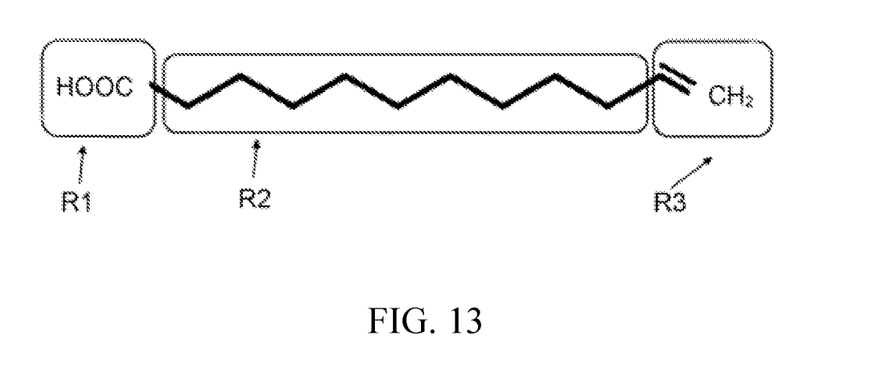
FIG. 13 is a schematic diagram of a chemical structure of a ligand that modifies hydroxyl groups on a surface of zinc oxide nanoparticles according to an exemplary embodiment of the present disclosure.
Figure 14:
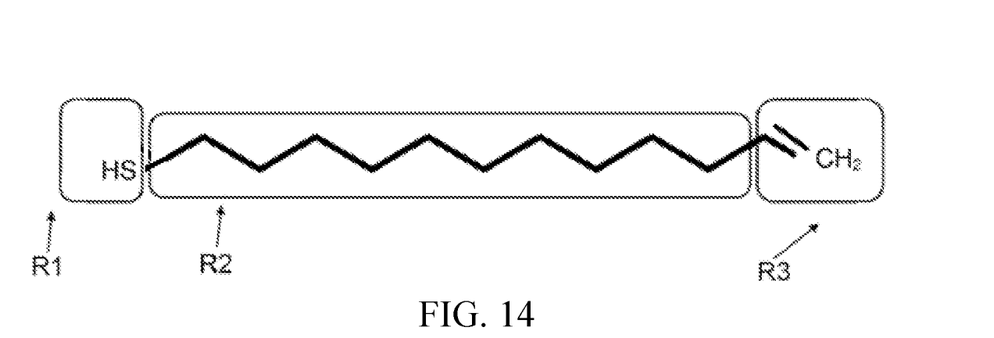
FIG. 14 is a schematic diagram of a chemical structure of a ligand that modifies $Zn^+$ on a surface of zinc oxide nanoparticles according to an exemplary embodiment of the present disclosure.

In an exemplary embodiment, when the inorganic metal oxide is zinc oxide, the preparation method may include: modifying hydroxyl groups and $Zn^+$ vacancies on the surface of the zinc oxide nanoparticle thin film or the zinc oxide thin film, wherein a ligand precursor of a ligand modifying the hydroxyl groups on the surface of the zinc oxide nanoparticle thin film or the zinc oxide thin film is a compound shown in FIG. 13, and a ligand precursor of a ligand modifying the $Zn^+$ vacancies on the surface of the zinc oxide nanoparticle thin film or the zinc oxide thin film is a compound shown in FIG. 14.

In an exemplary embodiment, when the ligand precursor solution is formulated, a volume ratio of the ligand precursor to the solvent may be (0.1 to 3):100.

In an exemplary embodiment, the time for standing may be 1 min to 5 min.

In an exemplary embodiment, the solvent may be selected from any one or more of acetonitrile, chloroform and dimethyl sulfoxide.

In an exemplary embodiment, the preparing an inorganic metal oxide nanoparticle thin film may include: spin coating inorganic metal oxide nanoparticles, and heating to form the inorganic metal oxide nanoparticle thin film.

In an exemplary embodiment, a heating temperature in the heating to form the inorganic metal oxide nanoparticle thin film may be 80° C. to 120° C.

In an exemplary embodiment, the preparing an inorganic metal oxide thin film may include: dissolving a precursor of an inorganic metal in a solvent to obtain a precursor solution of the inorganic metal; and spin coating the precursor solution of the inorganic metal, and heating to remove the solvent.

In an exemplary embodiment, the solvent may be a mixed solvent of ethanolamine and n-butanol.

In an exemplary embodiment, a temperature in the heating to remove the solvent may be 250° C. to 300° C.

An embodiment of the present disclosure further provides a display apparatus, including a plurality of electroluminescent devices described above.

Other aspects may be understood upon reading and understanding the drawings and detailed description.

BRIEF DESCRIPTION OF DRAWINGS

Accompanying drawings are used for providing understanding of technical solutions of the present disclosure, and form a part of the specification. They are used for explaining the technical solutions of the present disclosure together with the embodiments of the present disclosure, but do not form a limitation on the technical solutions of the present disclosure.

Meanings of reference signs in the accompanying drawings are as follows:

1—zinc oxide nanoparticles; 2—zinc oxide thin film; 10—cathode; 20—electron transport layer; 30—quantum dot light emitting layer; 40—hole transport layer; 50—hole injection layer; and 60—anode.

DETAILED DESCRIPTION

Implementations herein may be implemented in multiple different forms. Those of ordinary skills in the art may readily appreciate a fact that the implementations and contents may be varied into various forms without departing from the spirit and scope of the present disclosure. Therefore, the present disclosure should not be explained as being limited to contents described in following implementation modes only. The embodiments in the present disclosure and features in the embodiments may be combined randomly with each other without conflict.

In the accompanying drawings, a size of a constituent element, a thickness of a layer or a region is sometimes exaggerated for clarity. Therefore, any one implementation of the present disclosure is not necessarily limited to dimensions shown in the drawings, and the shapes and sizes of the components in the accompanying drawings do not reflect actual scales. In addition, the accompanying drawings schematically show an ideal example, and any one implementation of the present disclosure is not limited to the shapes, values, or the like shown in the accompanying drawings.

Figure 1:
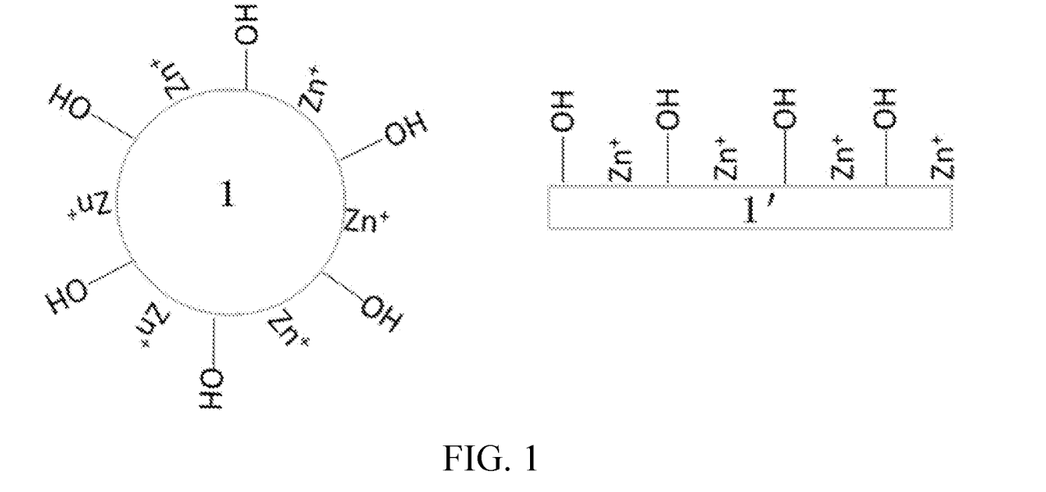
FIG. 1 is a schematic diagram of structure of zinc oxide nanoparticles and a zinc oxide thin film.

N-type metal oxides with a low work function, such as zinc oxide, etc. are used as electron transport layers of quantum dot light emitting diodes because of their effective electron injection. However, both zinc oxide nanoparticles and zinc oxide thin films prepared by a sol-gel method have a large number of hydroxyl groups and Zn cations exposed on the outermost layer of the surface, and these exposed groups will greatly affect the efficiency of QLEDs. FIG. 1 is a schematic diagram of structure of zinc oxide nanoparticles and a zinc oxide thin film.

An embodiment of the present disclosure provides an electron transport material, including: an inorganic metal oxide nanoparticle and a ligand modifying the inorganic metal oxide nanoparticle, the ligand including a coordination group coordination-bonded to a defect site on a surface of the inorganic metal oxide nanoparticle, the defect site including at least one of a hydroxyl group and a metal cation.

For the electron transport material according to an embodiment of the present disclosure, by modifying defect sites on the surface of the inorganic metal oxide nanoparticles, the defect sites on the surface of the inorganic metal oxide nanoparticles can be reduced. When the modified inorganic metal oxide nanoparticles are used as a material of an electron transport layer of a quantum dot light emitting device, direct contact between quantum dots and the defect sites on the surface of the inorganic metal oxide nanoparticles can also be avoided, electron transfer at an interface can be avoided, thereby avoiding the quenching effect at the interface between the quantum dots and the inorganic metal oxide nanoparticles, and generation of Auger recombination channels with non-radiative transitions can also be reduced, thus improving the fluorescence performance of the quantum dots and the efficiency and stability of the quantum dot light emitting diode. In addition, the modified inorganic metal oxide nanoparticles can realize balanced charge injection of carriers in the quantum dot light emitting device.

In an exemplary embodiment, the coordination group may be selected from any one or more of amino, polyamino, hydroxyl, polyhydroxyl, carboxyl, mercapto, polymercapto, thioether, polythioether, phosphino and phosphinyl.

In an exemplary embodiment, the ligand may further include a ligand length regulating group which may be an alkyl chain.

In an exemplary embodiment, the number of carbon atoms of the alkyl chain may be 1 to 18, e.g., 6 to 16. The use of alkyl chains which may have 1 to 18 carbon atoms to regulate the length of the ligand enables the ligand-modified inorganic metal oxide nanoparticles to block the injection of electrons, balance the holes and carriers, and enhance the device efficiency.

In an exemplary embodiment, the alkyl chain may be at least one of ethyl, n-butyl, tert-butyl, n-octyl, tert-butylphenyl, methoxyl, or n-butoxyl.

In an exemplary embodiment, the ligand may further include a dissolving group, which is a group dissolved in a polar solvent, a group dissolved in a non-polar solvent, or a crosslinking group. The dissolving group can adjust the solubility of the ligand, so that the ligand-modified inorganic metal oxide nanoparticles exhibit a hydrophilic, hydrophobic or crosslinkable state. Therefore, when the electron transport material according to an embodiment of the present disclosure is used to prepare a light emitting device, the solubility of the electron transport material may be adjusted according to the requirements of a lower film layer (i.e., a film layer formed after the formation of an electron transport layer in the process of preparing the light emitting device), thereby increasing process compatibility of device preparation.

In an exemplary embodiment, the group dissolved in the polar solvent may be selected from any one or more of amino, polyamino, hydroxyl, polyhydroxyl, mercapto and polymercapto.

In an exemplary embodiment, the group dissolved in the non-polar solvent may be selected from any one or more of methyl and ethyl.

In an exemplary embodiment, the crosslinking group may be selected from any one or more of a double bond, a triple bond and an epoxy bond.

In an exemplary embodiment, the crosslinking group may be selected from any one or more of an olefin, an alkyne, an ester group, an aldehyde group, a carbonyl group, an azide group, a cyano group, an epoxyethane group, an epoxypropane group, an epoxybutane group, and an epoxypentane group.

In an exemplary embodiment, the ligand may include a coordination group, a length regulating group and a dissolving group, and the coordination group and the dissolving group are respectively bonded to two ends of the length regulating group.

In an exemplary embodiment, the inorganic metal oxide nanoparticle may be selected from any one or more of an N-type metal oxide nanoparticle and a P-type metal oxide nanoparticle, the N-type metal oxide nanoparticle may include a ZnO nanoparticle and a $TiO_2$ nanoparticle, and the P-type metal oxide nanoparticle may include a $SnO_2$ nanoparticle, a $ZrO_2$ nanoparticle, a NiO nanoparticle, a $WoO_3$ nanoparticle, a $V_2O_5$ nanoparticle, a CuO nanoparticle, a CuS nanoparticle, a CuSCN nanoparticle and a Cu:NiO nanoparticle.

In an exemplary embodiment, the inorganic metal oxide nanoparticle may be a ZnO nanoparticle, including ZnO nanoparticles doped by Mg, In, Al, Ga, Sn, Li, etc.

An embodiment of the present disclosure further provides an electroluminescent device, including an electron transport layer, a material of the electron transport layer being the electron transport material described above.

In an exemplary embodiment, the electroluminescent device may be a quantum dot light emitting diode (QLED) or an organic light emitting diode (OLED).

Figure 2:
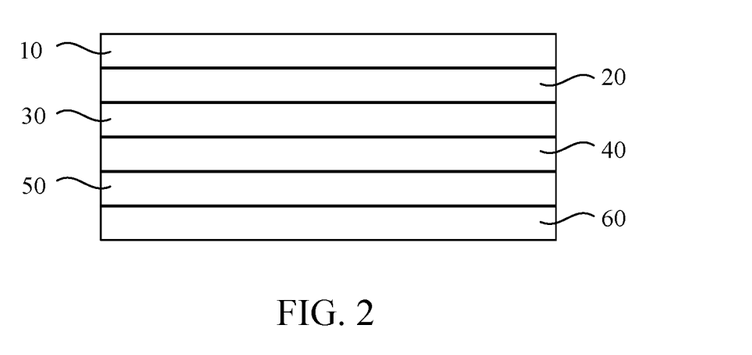
FIG. 2 is a schematic diagram of structure of a quantum dot light emitting device according to an exemplary embodiment of the present disclosure.

FIG. 2 is a schematic diagram of structure of a quantum dot light emitting device according to an exemplary embodiment of the present disclosure. As shown in FIG. 2, the quantum dot light emitting device may include a cathode 10, an electron transport layer 20, a quantum dot light emitting layer 30, a hole transport layer 40, a hole injection layer 50 and an anode 60, the electron transport layer 20 is disposed on a surface of the cathode 10 on a side, the quantum dot light emitting layer 30 is disposed on a surface of the electron transport layer 20 on a side away from the cathode 10, the hole transport layer 40 is disposed on a surface of the quantum dot light emitting layer 30 on a side away from the electron transport layer 20, the hole injection layer 50 is disposed on a surface of the hole transport layer 40 on a side away from the quantum dot light emitting layer 30, and the anode 60 is disposed on a surface of the hole injection layer 50 on a side away from the hole transport layer 40. The cathode may be ITO (Indian Tin Oxide) conductive glass or FTO (F-doped Tin Oxide) conductive glass.

The quantum dot light emitting layer 30 is made of nanoparticles having a core-shell structure, for example, a material of the core may be selected from one or more of CdS, CdSe, CdSeS, CdTe, CdTeS, ZnSe, ZnCdSe, InP, CuInS, PbS, $CsPbCl_3$, $CsPbBr_3$, and $CsPbI_3$; and a material of the shell layer may be selected from one or more of ZnS, CdS, ZnSe, ZnSeS, CdZnS, ZnO, ZnCdS, and $Cd_xZn_{1-x}Se_yS_{1-y}$, wherein $0<x<1$, $0<y<1$.

An embodiment of the present disclosure further provides a preparation method for an electroluminescent device, including:
preparing an inorganic metal oxide nanoparticle thin film or preparing an inorganic metal oxide thin film; and
performing interface modification on at least one of a hydroxyl group and a metal cation on a surface of the inorganic metal oxide nanoparticle thin film or the inorganic metal oxide thin film by using a ligand.

In an exemplary embodiment, the ligand may include a coordination group coordination-bonded to a defect site on a surface of the inorganic metal oxide nanoparticle, and the defect site includes at least one of a hydroxyl group and a metal cation.

In an exemplary embodiment, the coordination group may be selected from any one or more of amino, polyamino, hydroxyl, polyhydroxyl, carboxyl, mercapto, polymercapto, thioether, polythioether, phosphino and phosphinyl.

In an exemplary embodiment, the ligand may further include a ligand length regulating group which may be an alkyl chain.

In an exemplary embodiment, the number of carbon atoms of the alkyl chain may be 1 to 18, e.g., 6 to 16.

In an exemplary embodiment, the alkyl chain may be at least one of ethyl, n-butyl, tert-butyl, n-octyl, tert-butylphenyl, methoxyl, or n-butoxyl.

In an exemplary embodiment, the ligand may further include a dissolving group, which is a group dissolved in a polar solvent, a group dissolved in a non-polar solvent, or a crosslinking group.

In an exemplary embodiment, the group dissolved in the polar solvent may be selected from any one or more of amino, polyamino, hydroxyl, polyhydroxyl, mercapto and polymercapto.

In an exemplary embodiment, the group dissolved in the non-polar solvent may be selected from any one or more of methyl and ethyl.

In an exemplary embodiment, the crosslinking group may be selected from any one or more of a double bond, a triple bond and an epoxy bond.

In an exemplary embodiment, the crosslinking group may be selected from any one or more of an olefin, an alkyne, an ester group, an aldehyde group, a carbonyl group, an azide group, a cyano group, an epoxyethane group, an epoxypropane group, an epoxybutane group, and an epoxypentane group.

In an exemplary embodiment, the ligand may include a coordination group, a length regulating group and a dissolving group, and the coordination group and the dissolving group are respectively bonded to two ends of the length regulating group.

In an exemplary embodiment, the inorganic metal oxide may be selected from any one or more of an N-type metal oxide nanoparticle and a P-type metal oxide nanoparticle, the N-type metal oxide nanoparticle may include a ZnO nanoparticle and a $TiO_2$ nanoparticle, and the P-type metal oxide nanoparticle may include a $SnO_2$ nanoparticle, a $ZrO_2$ nanoparticle, a NiO nanoparticle, a $WO_3$ nanoparticle, a $V_2O_5$ nanoparticle, a CuO nanoparticle, a CuS nanoparticle, a CuSCN nanoparticle and a Cu:NiO nanoparticle.

In an exemplary embodiment, the performing interface modification on at least one of a hydroxyl group and a metal cation on a surface of the inorganic metal oxide nanoparticle thin film or the inorganic metal oxide thin film by using a ligand may include:
dissolving a ligand precursor in a solvent to prepare a ligand precursor solution; and
dropping the ligand precursor solution onto the surface of the inorganic metal oxide nanoparticle thin film or the inorganic metal oxide thin film, standing, spinning dry, and cleaning with the solvent.

In an exemplary embodiment, when the inorganic metal oxide is zinc oxide, the preparation method may include: modifying hydroxyl groups and $Zn^+$ vacancies on the surface of the zinc oxide nanoparticle thin film or the zinc oxide thin film, wherein a ligand precursor of a ligand modifying the hydroxyl groups on the surface of the zinc oxide nanoparticle thin film or the zinc oxide thin film is 1,12-dodecanedioic acid, and a ligand precursor of a ligand modifying the $Zn^+$ vacancies on the surface of the zinc oxide nanoparticle thin film or the zinc oxide thin film is 1,12-dodecanedithiol.

In an exemplary embodiment, when the inorganic metal oxide is zinc oxide, the preparation method may include: modifying hydroxyl groups and $Zn^+$ vacancies on the surface of the zinc oxide nanoparticle thin film or the zinc oxide thin film, wherein a ligand precursor of a ligand modifying the hydroxyl groups on the surface of the zinc oxide nanoparticle thin film or the zinc oxide thin film is lauric acid, and a ligand precursor of a ligand modifying the $Zn^+$ vacancies on the surface of the zinc oxide nanoparticle thin film or the zinc oxide thin film is dodecanethiol.

In an exemplary embodiment, when the inorganic metal oxide is zinc oxide, the preparation method may include: modifying hydroxyl groups and $Zn^+$ vacancies on the surface of the zinc oxide nanoparticle thin film or the zinc oxide thin film, wherein a ligand precursor of a ligand modifying the hydroxyl groups on the surface of the zinc oxide nanoparticle thin film or the zinc oxide thin film is a compound shown in FIG. 13, and a ligand precursor of a ligand modifying the $Zn^+$ vacancies on the surface of the zinc oxide nanoparticle thin film or the zinc oxide thin film is a compound shown in FIG. 14.

In an exemplary embodiment, when the ligand precursor solution is formulated, a volume ratio of the ligand precursor to the solvent may be (0.1 to 3):100.

In an exemplary embodiment, when the ligand precursor solution contains both a ligand precursor modifying hydroxyl groups and a ligand precursor modifying $Zn^+$ vacancies, a ratio of a total volume of the two ligand precursors to a volume of the solvent may be (0.1 to 3):100; and a volume ratio between the two ligand precursors may be 1:2 to 2:1, for example, may be 1:2, 1:1 or 2:1.

In an exemplary embodiment, the time for standing may be 1 min to 5 min.

In an exemplary embodiment, the solvent may be selected from any one or more of acetonitrile, chloroform and dimethyl sulfoxide.

In an exemplary embodiment, the preparing an inorganic metal oxide nanoparticle thin film may include: spin coating inorganic metal oxide nanoparticles, and heating to form the inorganic metal oxide nanoparticle thin film.

In an exemplary embodiment, a heating temperature in the heating to form the inorganic metal oxide nanoparticle thin film may be 80° C. to 120° C.

In an exemplary embodiment, the preparing an inorganic metal oxide thin film may include: dissolving a precursor of an inorganic metal in a solvent to obtain a precursor solution of the inorganic metal; and spin coating the precursor solution of the inorganic metal, and heating to remove the solvent.

In an exemplary embodiment, the solvent may be a mixed solvent of ethanolamine and n-butanol.

In an exemplary embodiment, the precursor of the inorganic metal may be an acetate of the inorganic metal, an nitrate of the inorganic metal, etc.

In an exemplary embodiment, a temperature in the heating to remove the solvent may be 250° C. to 300° C.

An embodiment of the present disclosure further provides a display apparatus, including a plurality of electroluminescent devices described above.

The display apparatus may be any product or component with a display function, such as a mobile phone, a tablet computer, a television, a display, a notebook computer, a digital photo frame, a navigator, a vehicle-mounted display, a smart watch or a smart bracelet.

In an exemplary embodiment, a preparation method for a quantum dot light emitting diode may include:

(1) preparation of a cathode: ultrasonically cleaning conductive glass (ITO conductive glass or FTO conductive glass, etc.) with water and isopropanol respectively, and treating it under ultraviolet (UV) for 5 min to 10 min;

(2) preparation of an electron transport layer on the cathode: wherein the electron transport layer may be a zinc oxide nanoparticle thin film or a zinc oxide thin film;

(a) preparation of the zinc oxide nanoparticle thin film: spin coating zinc oxide nanoparticles on the conductive glass, heating at 80° C. to 120° C. to form a film, wherein a rotating speed of a spin coater during film formation may be set to 500 rpm to 2500 rpm to adjust a thickness of the film layer; ion-doped zinc oxide nanoparticles, such as Mg, In, Al and Ga doped zinc oxide nanoparticles, etc., may also be selected as electron transport materials;

(b) preparation of the zinc oxide thin film: dissolving 1 g of zinc acetate (or zinc nitrate, etc.) in a 5 mL mixed solution of ethanolamine and n-butanol to obtain a zinc precursor solution; placing the conductive glass cleaned in step (1) on the spin coater, dropping 90 µL to 120 µL of the zinc precursor solution on the conductive glass, spin coating, placing the conductive glass on a 250° C. to 300° C. hot table, heating to evaporate the solvent, and introducing a polyetherimide film layer onto the conductive glass;

(3) modification of zinc oxide into a hydrophilic structure: dissolving 1,12-dodecanedioic acid and 1,12-dodecanedithiol in an acetonitrile solution and mixing sufficiently to obtain a ligand precursor solution, wherein a ratio of a total volume of 1,12-dodecanedioic acid and 1,12-dodecanedithiol to a volume of acetonitrile is (0.1 to 3):100, and a volume ratio of 1,12-dodecanedioic acid to 1,12-dodecanedithiol may be 1:2 to 2:1, for example, may be 1:2, 1:1 or 2:1; dropping the ligand precursor solution onto the zinc oxide nanoparticle thin film or the zinc oxide thin film prepared in step (2), standing for 1 min to 5 min, modifying hydroxyl groups on a surface of zinc oxide with 1,12-dodecanedioic acid, and modifying $Zn^+$ vacancies on the surface of zinc oxide with 1,12-dodecanedithiol, then spinning dry, and washing with acetonitrile several times;

(4) preparation of a water-soluble quantum dot light emitting layer on the electron transport layer: spin coating water-soluble quantum dots on the electron transport layer, wherein a terminal of a ligand of a water-soluble quantum dot is generally amino, polyamino, hydroxyl, polyhydroxyl, mercapto, polymercapto, which has good compatibility with the hydrophilic zinc oxide thin film obtained in step (3) and can form a spin coated thin film with good quality;

(5) sequential evaporation of a hole transport layer and a hole injection layer on the quantum dot light emitting layer;

(6) preparation of an anode on the quantum dot light emitting layer: introducing an anode material on the quantum dot light emitting layer to prepare an anode of a QLED device, e.g., evaporating an aluminum film, a silver film or sputtering an Indium Zinc Oxide (IZO) film, wherein the anode may have a single-layered or laminated structure; and (7) encapsulation: adding an encapsulation cover plate, and encapsulating the device with an ultraviolet curing adhesive to obtain a quantum dot light emitting diode.

Figure 3:
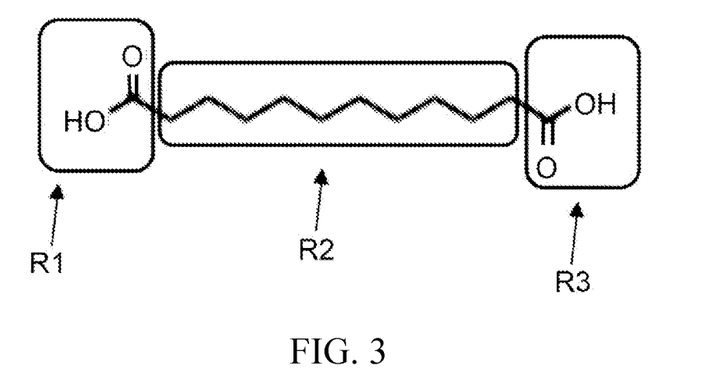
FIG. 3 is a schematic diagram of a chemical structure of 1,12-dodecanedioic acid.
Figure 4:
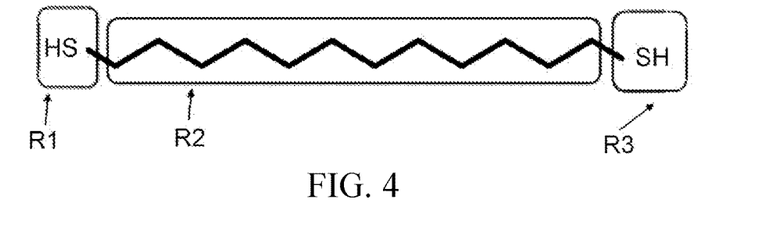
FIG. 4 is a schematic diagram of a chemical structure of 1,12-dodecanedithiol.
Figure 5:
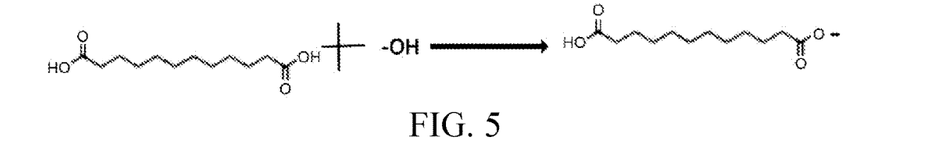
FIG. 5 is a schematic diagram of a reaction equation of a reaction of 1,12-dodecanedioic acid with hydroxyl groups on a surface of ZnO.
Figure 6:
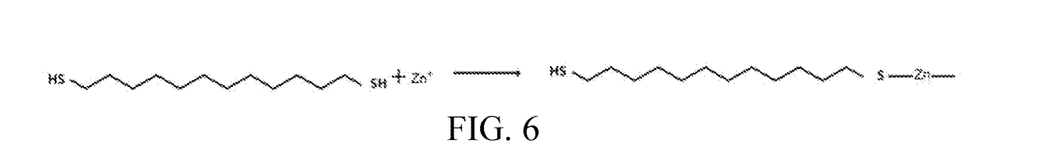
FIG. 6 is a schematic diagram of a reaction equation of a reaction of 1,12-dodecanedithiol with $Zn^+$ on a surface of ZnO.
Figure 7:
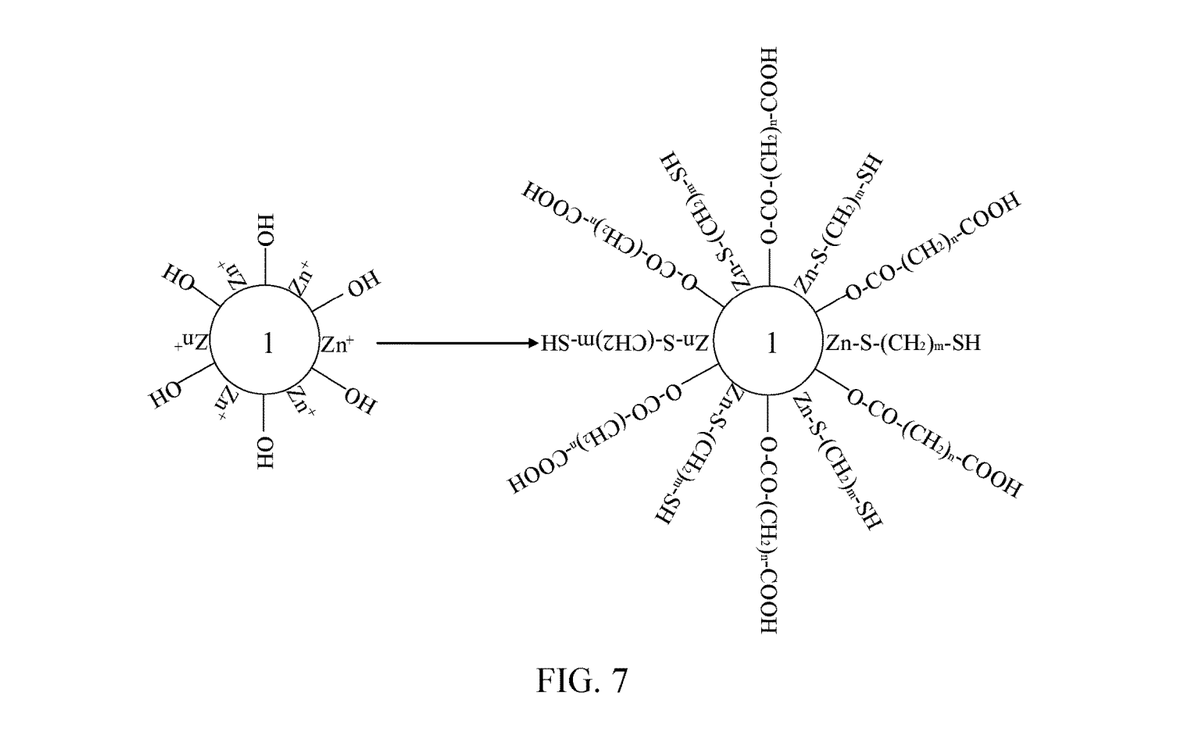
FIG. 7 is a schematic diagram of a process of modifying zinc oxide nanoparticles using 1,12-dodecanedioic acid and 1,12-dodecanedithiol according to an exemplary embodiment of the present disclosure.
Figures 8, 9:
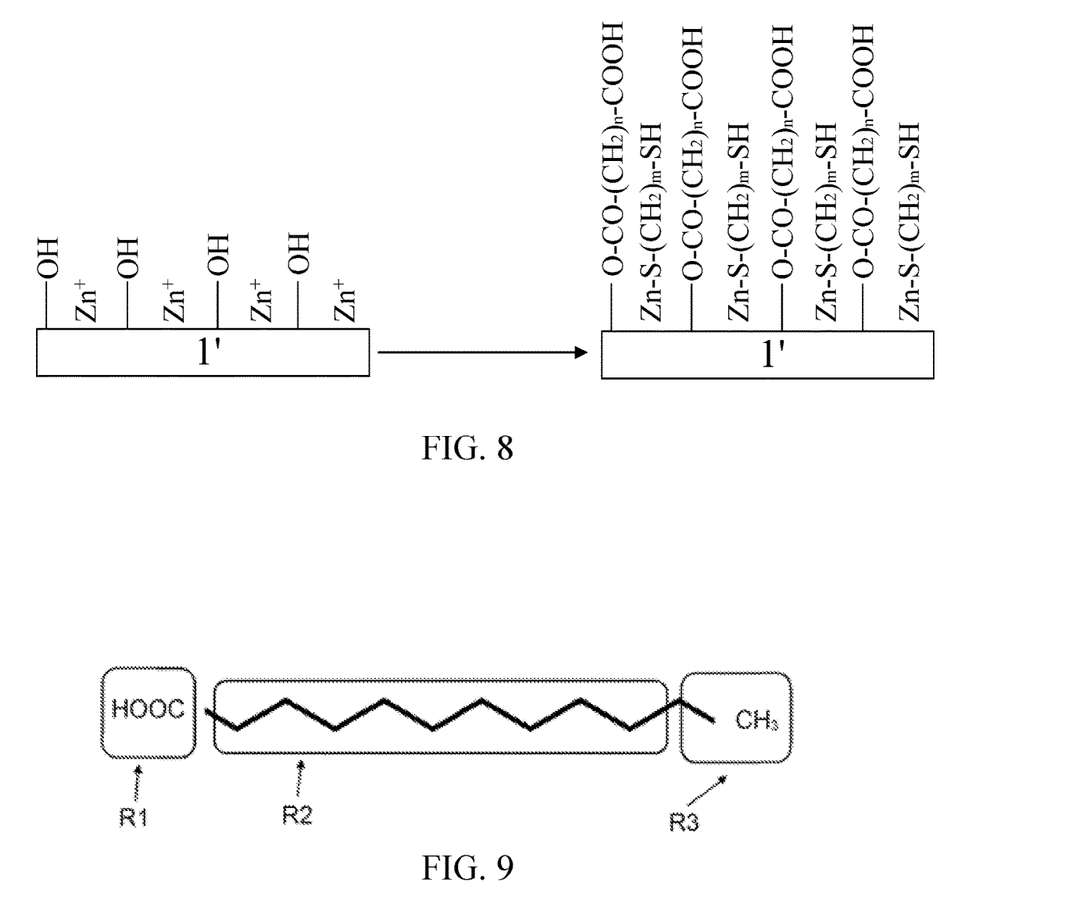
FIG. 8 is a schematic diagram of a process of modifying a zinc oxide thin film using 1,12-dodecanedioic acid and 1,12-dodecanedithiol according to an exemplary embodiment of the present disclosure.
FIG. 9 is a schematic diagram of a chemical structure of lauric acid.

FIG. 3 is a schematic diagram of a chemical structure of 1,12-dodecanedioic acid; FIG. 4 is a schematic diagram of a chemical structure of 1,12-dodecanedithiol; FIG. 5 is a schematic diagram of a reaction equation of a reaction of 1,12-dodecanedioic acid with hydroxyl groups on a surface of ZnO; FIG. 6 is a schematic diagram of a reaction equation of a reaction of 1,12-dodecanedithiol with $Zn^+$ on a surface of ZnO; wherein R1 represents a coordination group, a length regulating group and a dissolving group; FIG. 7 is a schematic diagram of a process of modifying zinc oxide nanoparticles using 1,12-dodecanedioic acid and 1,12-dodecanedithiol according to an exemplary embodiment of the present disclosure, m=12, n=10; and FIG. 8 is a schematic diagram of a process of modifying a zinc oxide thin film using 1,12-dodecanedioic acid and 1,12-dodecanedithiol according to an exemplary embodiment of the present disclosure, m=12, n=10.

In an exemplary embodiment, a preparation method for a quantum dot light emitting diode may include:

(1) preparation of a cathode: ultrasonically cleaning conductive glass (ITO conductive glass or FTO conductive glass, etc.) with water and isopropanol respectively, and treating it under ultraviolet (UV) for 5 min to 10 min;

(2) preparation of an electron transport layer on the cathode: wherein the electron transport layer may be a zinc oxide nanoparticle thin film or a zinc oxide thin film;

(a) preparation of the zinc oxide nanoparticle thin film: spin coating zinc oxide nanoparticles on the conductive glass, heating at 80° C. to 120° C. to form a film, wherein a rotating speed of a spin coater during film formation may be set to 500 rpm to 2500 rpm to adjust a thickness of the film layer; ion-doped zinc oxide nanoparticles, such as Mg, In, Al and Ga doped zinc oxide nanoparticles, etc., may also be selected as electron transport materials;

(b) preparation of the zinc oxide thin film: dissolving 1 g of zinc acetate (or zinc nitrate, etc.) in a 5 mL mixed solution of ethanolamine and n-butanol to obtain a zinc precursor solution; placing the conductive glass cleaned in step (1) on the spin coater, dropping 90 μL to 120 μL of the zinc precursor solution on the conductive glass, spin coating, placing the conductive glass on a 250° C. to 300° C. hot table, heating to evaporate the solvent, and introducing a polyetherimide film layer onto the conductive glass;

(3) modification of zinc oxide into a hydrophobic structure: dissolving lauric acid and dodecanethiol in an acetonitrile solution and mixing sufficiently to obtain a ligand precursor solution, wherein a ratio of a total volume of lauric acid and dodecanethiol to a volume of acetonitrile is (0.1 to 3):100, and a volume ratio of lauric acid to dodecanethiol may be 1:2 to 2:1, for example, may be 1:2, 1:1 or 2:1; dropping the ligand precursor solution onto the zinc oxide nanoparticle thin film or the zinc oxide thin film prepared in step (2), standing for 1 min to 5 min, modifying hydroxyl groups on a surface of zinc oxide with lauric acid, and modifying $Zn^+$ vacancies on the surface of zinc oxide with dodecanethiol, then spinning dry, and washing with acetonitrile several times;

(4) preparation of an oil-soluble quantum dot light emitting layer on the electron transport layer: spin coating oil-soluble quantum dots on the electron transport layer, wherein a terminal of a ligand of such a quantum dot is generally an alkyl chain such as methyl, ethyl, which has good compatibility with the hydrophobic zinc oxide thin film obtained in step (3) and can form a spin coated thin film with good quality;

(5) sequential evaporation of a hole transport layer and a hole injection layer on the quantum dot light emitting layer;

(6) preparation of an anode on the quantum dot light emitting layer: introducing an anode material on the quantum dot light emitting layer to prepare an anode of a QLED device, e.g., evaporating an aluminum film, a silver film or sputtering an Indium Zinc Oxide (IZO) film, wherein the anode may have a single-layered or laminated structure; and (7) encapsulation: adding an encapsulation cover plate, and encapsulating the device with an ultraviolet curing adhesive to obtain a quantum dot light emitting diode.

Figure 10:
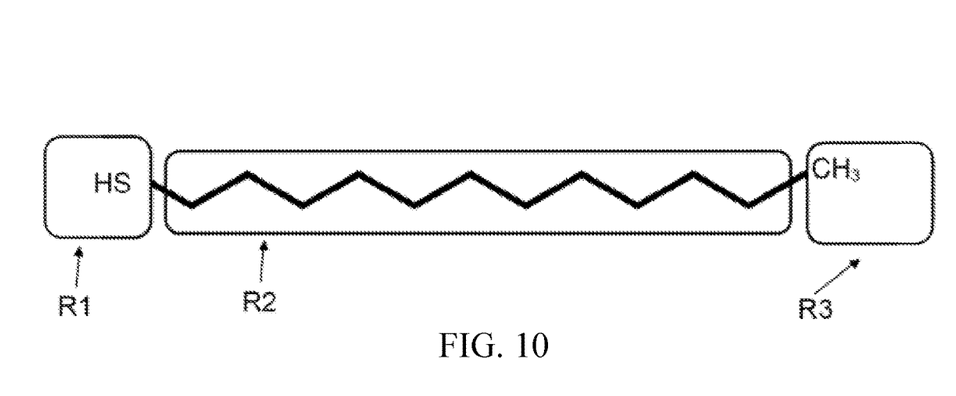
FIG. 10 is a schematic diagram of a chemical structure of dodecanethiol.
Figure 11:
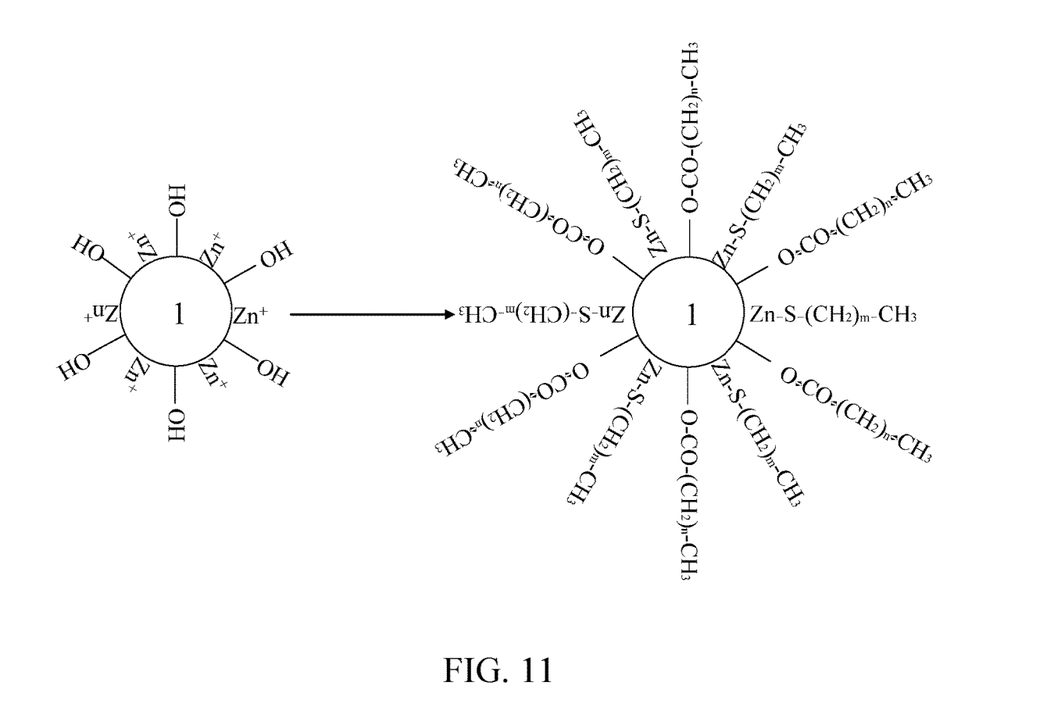
FIG. 11 is a schematic diagram of a process of modifying zinc oxide nanoparticles using lauric acid and dodecanethiol according to an exemplary embodiment of the present disclosure.
Figure 12:
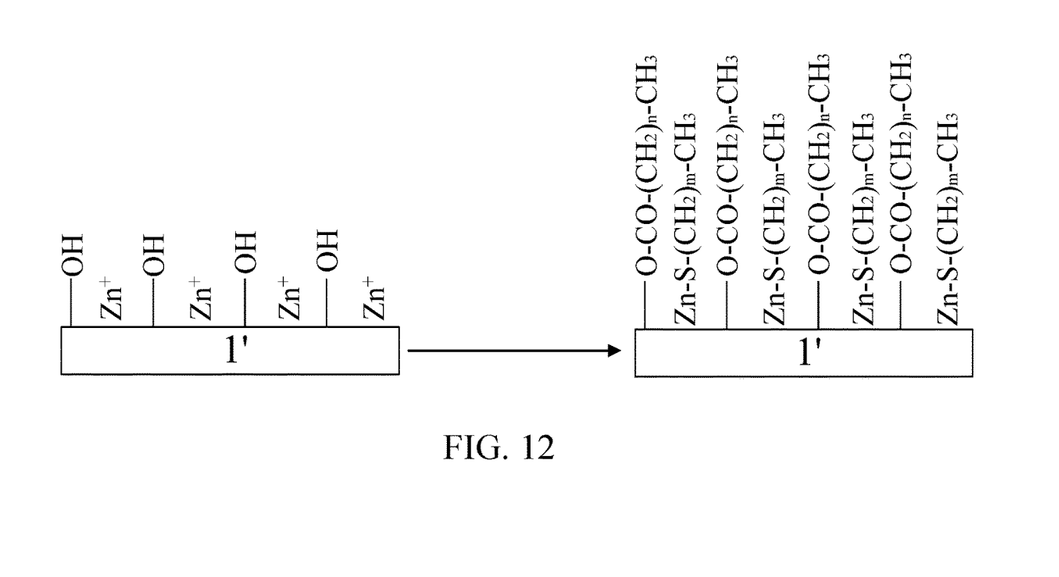
FIG. 12 is a schematic diagram of a process of modifying a zinc oxide thin film using lauric acid and dodecanethiol according to an exemplary embodiment of the present disclosure.

FIG. 9 is a schematic diagram of a chemical structure of lauric acid; FIG. 10 is a schematic diagram of a chemical structure of dodecanethiol; wherein R1 represents a coordination group, a length regulating group and a dissolving group; FIG. 11 is a schematic diagram of a process of modifying zinc oxide nanoparticles using lauric acid and dodecanethiol according to an exemplary embodiment of the present disclosure, m=11, n=10; and FIG. 12 is a schematic diagram of a process of modifying a zinc oxide thin film using lauric acid and dodecanethiol according to an exemplary embodiment of the present disclosure, m=11, n=10.

In an exemplary embodiment, a preparation method for a quantum dot light emitting diode may include:

(1) preparation of a cathode: ultrasonically cleaning conductive glass (ITO conductive glass or FTO conductive glass, etc.) with water and isopropanol respectively, and treating it under ultraviolet (UV) for 5 min to 10 min;

(2) preparation of an electron transport layer on the cathode: wherein the electron transport layer may be a zinc oxide nanoparticle thin film or a zinc oxide thin film;

(a) preparation of the zinc oxide nanoparticle thin film: spin coating zinc oxide nanoparticles on the conductive glass, heating at 80° C. to 120° C. to form a film, wherein a rotating speed of a spin coater during film formation may be set to 500 rpm to 2500 rpm to adjust a thickness of the film layer; ion-doped zinc oxide nanoparticles, such as Mg, In, Al and Ga doped zinc oxide nanoparticles, etc., may also be selected as electron transport materials;

(b) preparation of the zinc oxide thin film: dissolving 1 g of zinc acetate (or zinc nitrate, etc.) in a 5 mL mixed solution of ethanolamine and n-butanol to obtain a zinc precursor solution; placing the conductive glass cleaned in step (1) on the spin coater, dropping 90 μL to 120 μL of the zinc precursor solution on the conductive glass, spin coating, placing the conductive glass on a 250° C. to 300° C. hot table, heating to evaporate the solvent, and introducing a polyetherimide film layer onto the conductive glass;

(3) modification of zinc oxide into a structure crosslinkable with a quantum dot light emitting layer: dissolving a compound shown in FIG. 13 and a compound shown in FIG. 14 in an acetonitrile solution and mixing sufficiently to obtain a ligand precursor solution, wherein a ratio of a total volume of the compound shown in FIG. 13 and the compound shown in FIG. 14 to a volume of acetonitrile is (0.1 to 3):100, and a volume ratio of the compound shown in FIG. 13 to the compound shown in FIG. 14 may be 1:2 to 2:1, for example, may be 1:2, 1:1 or 2:1; dropping the ligand precursor solution onto the zinc oxide nanoparticle thin film or the zinc oxide thin film prepared in step (2), standing for 1 min to 5 min, modifying hydroxyl groups on a surface of zinc oxide with the compound shown in FIG. 13, and modifying $Zn^+$ vacancies on the surface of zinc oxide with the compound shown in FIG. 14, then spinning dry, and washing with acetonitrile several times;

(4) preparation of a quantum dot layer with a terminal of a ligand being a crosslinking group on the electron transport layer: spin coating quantum dots on the electron transport layer, wherein a terminal of a ligand of the quantum dot is a double bond, a triple bond, an epoxy bond, etc., which, for example, may be an olefin, an alkyne, an ester group, an aldehyde group, a carbonyl group, an azide group, a cyano group, an epoxyethane group, an epoxypropane group, an epoxybutane group, an epoxypentane group etc., and may be crosslinked with the zinc oxide thin film with a crosslinking structure obtained in step (3);

(5) sequential evaporation of a hole transport layer and a hole injection layer on the quantum dot light emitting layer;

(6) preparation of an anode on the quantum dot light emitting layer: introducing an anode material on the quantum dot light emitting layer to prepare an anode of a QLED device, e.g., evaporating an aluminum film, a silver film or sputtering an Indium Zinc Oxide (IZO) film, wherein the anode may have a single-layered or laminated structure; and (7) encapsulation: adding an encapsulation cover plate, and encapsulating the device with an ultraviolet curing adhesive to obtain a quantum dot light emitting diode.

Figure 15:
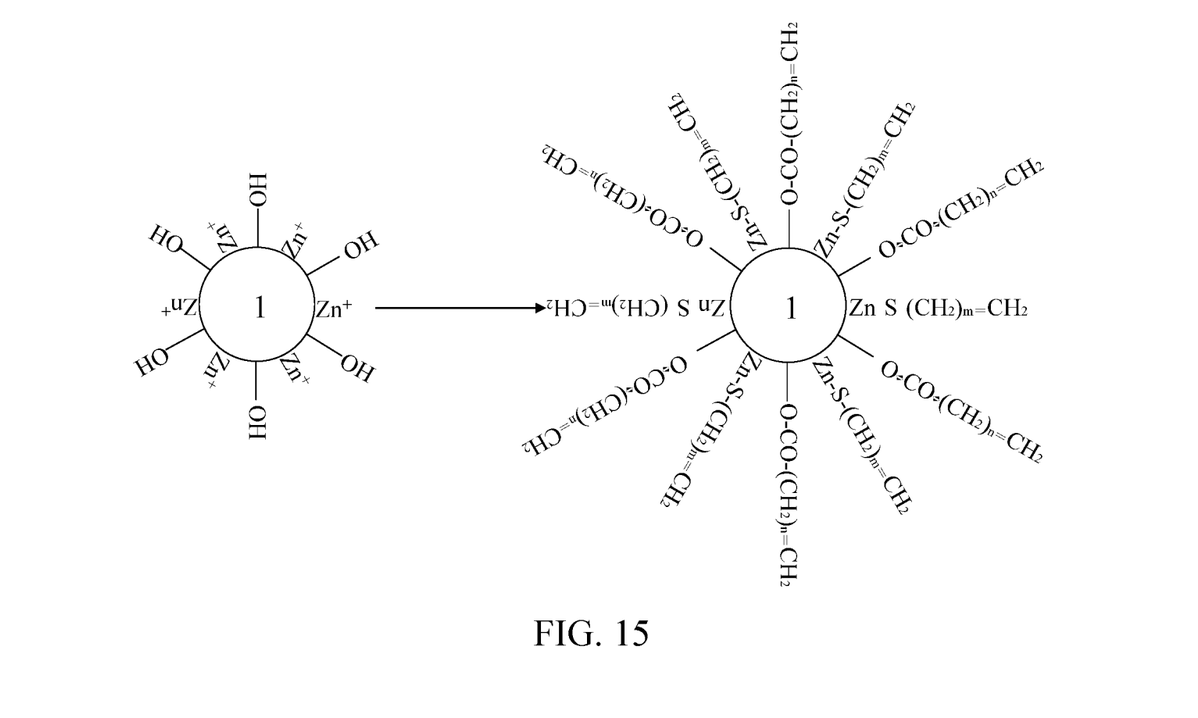
FIG. 15 is a schematic diagram of a process of modifying zinc oxide nanoparticles using a compound shown in FIG. 13 and a compound shown in FIG. 14 according to an exemplary embodiment of the present disclosure.
Figure 16:
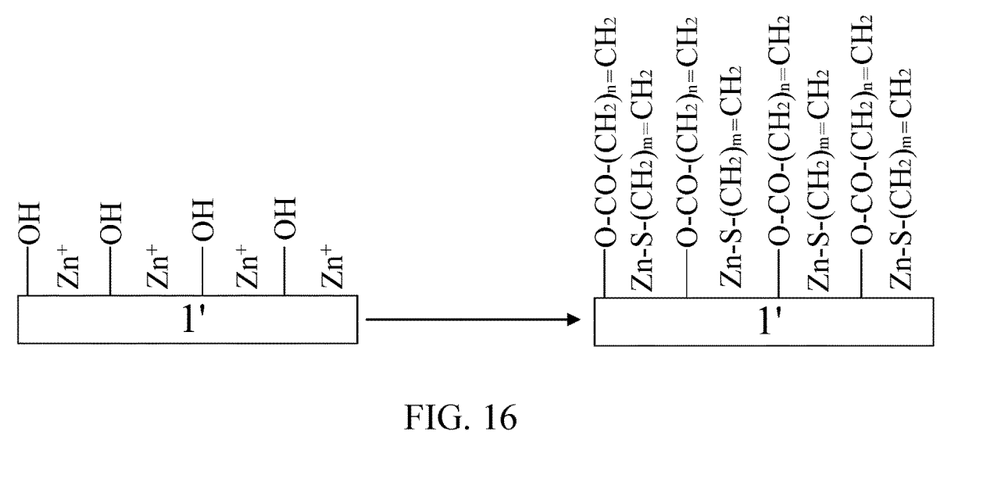
FIG. 16 is a schematic diagram of a process of modifying a zinc oxide thin film using a compound shown in FIG. 13 and a compound shown in FIG. 14 according to an exemplary embodiment of the present disclosure.

FIG. 13 is a schematic diagram of a chemical structure of a ligand that modifies hydroxyl groups on a surface of zinc oxide according to an exemplary embodiment of the present disclosure; FIG. 14 is a schematic diagram of a chemical structure of a ligand that modifies $Zn^+$ on a surface of zinc oxide according to an exemplary embodiment of the present disclosure; wherein R1 represents a coordination group, a length regulating group and a dissolving group; FIG. 15 is a schematic diagram of a process of modifying zinc oxide nanoparticles using a compound shown in FIG. 13 and a compound shown in FIG. 14 according to an exemplary embodiment of the present disclosure, m=11, n=10; and FIG. 16 is a schematic diagram of a process of modifying a zinc oxide thin film using a compound shown in FIG. 13 and a compound shown in FIG. 14 according to an exemplary embodiment of the present disclosure, m=11, n=10.

Although the implementation modes disclosed in the present disclosure are as above, the described contents are only implementation modes used for convenience of understanding the present disclosure and are not intended to limit the present disclosure. Any person skilled in the art may make any modification and change in the forms and details of the implementations without departing from the essence and scope of the present disclosure. However, the scope of patent protection of the present disclosure should still be subject to the scope defined by the appended claims.

The invention claimed is:

1. An electron transport material, comprising: an inorganic metal oxide nanoparticle and a ligand modifying the inorganic metal oxide nanoparticle,
the ligand comprising a coordination group coordination-bonded to a defect site on a surface of the inorganic metal oxide nanoparticle,
the defect site comprising at least one of a hydroxyl group and a metal cation.

2. The electron transport material according to claim 1, wherein the coordination group is selected from any one or more of amino, polyamino, hydroxyl, polyhydroxyl, carboxyl, mercapto, polymercapto, thioether, polythioether, phosphino and phosphinyl.

3. The electron transport material according to claim 1, wherein the ligand further comprises a ligand length regulating group which is an alkyl chain.

4. The electron transport material according to claim 3, wherein the number of carbon atoms of the alkyl chain is 1 to 18.

5. The electron transport material according to claim 4, wherein the alkyl chain is at least one of ethyl, n-butyl, tert-butyl, n-octyl, tert-butylphenyl, methoxyl, or n-butoxyl.

6. The electron transport material according to claim 3, wherein the ligand further comprises a dissolving group, which is a group dissolved in a polar solvent, a group dissolved in a non-polar solvent, or a crosslinking group.

7. The electron transport material according to claim 6, wherein the group dissolved in the polar solvent is selected from any one or more of amino, polyamino, hydroxyl, polyhydroxyl, mercapto and polymercapto.

8. The electron transport material according to claim 6, wherein the group dissolved in the non-polar solvent is selected from any one or more of methyl and ethyl.

9. The electron transport material according to claim 6, wherein the crosslinking group is selected from any one or more of a double bond, a triple bond and an epoxy bond.

10. The electron transport material according to claim 1, wherein
the inorganic metal oxide nanoparticle is selected from any one or more of an N-type metal oxide nanoparticle and a P-type metal oxide nanoparticle,
the N-type metal oxide nanoparticle comprises a ZnO nanoparticle and a $TiO_2$ nanoparticle, and
the P-type metal oxide nanoparticle comprises a $SnO_2$ nanoparticle, a $ZrO_2$ nanoparticle, a NiO nanoparticle, a $WoO_3$ nanoparticle, a $V_2O_5$ nanoparticle, a CuO nanoparticle, a CuS nanoparticle, a CuSCN nanoparticle and a Cu:NiO nanoparticle.

11. An electroluminescent device, comprising:
an electron transport layer, a material of the electron transport layer being the electron transport material according to claim 1.

12. A preparation method for an electroluminescent device, comprising:
preparing an inorganic metal oxide nanoparticle thin film or preparing an inorganic metal oxide thin film; and
performing interface modification on at least one of a hydroxyl group and a metal cation on a surface of the inorganic metal oxide nanoparticle thin film or the inorganic metal oxide thin film by using a ligand.

13. The preparation method according to claim 12, wherein the performing interface modification on at least one of a hydroxyl group and a metal cation on a surface of the inorganic metal oxide nanoparticle thin film or the inorganic metal oxide thin film by using a ligand comprises:
dissolving a ligand precursor in a solvent to prepare a ligand precursor solution; and
dropping the ligand precursor solution onto the surface of the inorganic metal oxide nanoparticle thin film or the inorganic metal oxide thin film, standing, spinning dry, and cleaning with the solvent.

14. The preparation method according to claim 13, wherein when the inorganic metal oxide is zinc oxide, the preparation method comprises: modifying hydroxyl groups and $Zn^+$ vacancies on a surface of a zinc oxide nanoparticle thin film or a zinc oxide thin film, wherein
a ligand precursor of a ligand modifying the hydroxyl groups on the surface of the zinc oxide nanoparticle thin film or the zinc oxide thin film is 1,12-dodecanedioic acid, and
a ligand precursor of a ligand modifying the $Zn^+$ vacancies on the surface of the zinc oxide nanoparticle thin film or the zinc oxide thin film is 1,12-dodecanedithiol.

15. The preparation method according to claim 13, wherein when the inorganic metal oxide is zinc oxide, the preparation method comprises: modifying hydroxyl groups and $Zn^+$ vacancies on the surface of the zinc oxide nanoparticle thin film or the zinc oxide thin film, wherein
a ligand precursor of a ligand modifying the hydroxyl groups on the surface of the zinc oxide nanoparticle thin film or the zinc oxide thin film is lauric acid, and
a ligand precursor of a ligand modifying the $Zn^+$ vacancies on the surface of the zinc oxide nanoparticle thin film or the zinc oxide thin film is dodecanethiol.

16. The preparation method according to claim 13, wherein when the inorganic metal oxide is zinc oxide, the preparation method comprises: modifying hydroxyl groups and $Zn^+$ vacancies on the surface of the zinc oxide nanoparticle thin film or the zinc oxide thin film, wherein a ligand precursor of a ligand modifying the hydroxyl groups on the surface of the zinc oxide nanoparticle thin film or the zinc oxide thin film is a compound as follows:

a ligand precursor of a ligand modifying the $Zn^+$ vacancies on the surface of the zinc oxide nanoparticle thin film or the zinc oxide thin film is a compound as follows:

17. The preparation method according to claim 13, wherein when the ligand precursor solution is formulated, a volume ratio of the ligand precursor to the solvent is (0.1 to 3):100;

wherein the time for standing is 1 min to 5 min;

wherein the solvent is selected from any one or more of acetonitrile, chloroform and dimethyl sulfoxide.

18. The preparation method according to claim 12, wherein the preparing an inorganic metal oxide nanoparticle thin film comprises:

spin coating inorganic metal oxide nanoparticles, and heating to form the inorganic metal oxide nanoparticle thin film; and a heating temperature in the heating to form the inorganic metal oxide nanoparticle thin film being 80° C. to 120° C.

19. The preparation method according to claim 12, wherein the preparing an inorganic metal oxide thin film comprises: dissolving a precursor of an inorganic metal in a solvent to obtain a precursor solution of the inorganic metal; and spin coating the precursor solution of the inorganic metal, and heating to remove the solvent; wherein the solvent is a mixed solvent of ethanolamine and n-butanol; and a temperature in the heating to remove the solvent is 250° C. to 300° C.

20. A display apparatus, comprising a plurality of electroluminescent devices according to claim 11.

* * * * *